United States Patent
Ha

(10) Patent No.: US 9,263,111 B2
(45) Date of Patent: *Feb. 16, 2016

(54) SUB-BLOCK DISABLING IN 3D MEMORY

(71) Applicant: Micron Technology, Inc., Boise, ID (US)

(72) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/682,762

(22) Filed: Apr. 9, 2015

(65) Prior Publication Data

US 2015/0213863 A1 Jul. 30, 2015

Related U.S. Application Data

(63) Continuation of application No. 13/781,097, filed on Feb. 28, 2013, now Pat. No. 9,007,860.

(51) Int. Cl.
*G11C 29/00* (2006.01)
*G11C 8/12* (2006.01)
(Continued)

(52) U.S. Cl.
CPC .. *G11C 8/12* (2013.01); *G11C 8/06* (2013.01); *G11C 8/08* (2013.01); *G11C 29/00* (2013.01); *G11C 29/78* (2013.01); *G11C 29/76* (2013.01); *G11C 29/832* (2013.01)

(58) Field of Classification Search
CPC .............. G11C 7/00; G11C 8/00; G11C 8/06; G11C 8/08; G11C 8/12; G11C 29/08; G11C 29/04; G11C 29/52; G11C 29/76; G11C 29/78; G11C 29/832

USPC .......... 365/200, 185.02, 185.09, 185.11, 201, 365/218, 230.03
See application file for complete search history.

(56) References Cited

U.S. PATENT DOCUMENTS 5,278,793 A * 1/1994 Yeh ........................ G11C 29/76
365/200
5,293,348 A 3/1994 Abe
(Continued)

FOREIGN PATENT DOCUMENTS

WO WO-2014134322 A1 9/2014

OTHER PUBLICATIONS

"International Application Serial No. PCT/US2014/019057, International Search Report mailed May 26, 2014", 6 pgs.
(Continued)

*Primary Examiner* — Tan T Nguyen
(74) *Attorney, Agent, or Firm* — Schwegman Lundberg & Woessner, P.A.

(57) ABSTRACT

Some embodiments relate to apparatuses and methods associated with blocks of memory cells. The blocks of memory cells may include two or more sub-blocks of memory cells. One such sub-block may comprise a vertical string of memory cells including a select transistor. An apparatus may include a sub-block disabling circuit. The sub-block disabling circuit may include a content-addressable memory. The content-addressable memory may receive an address, including a block address and a sub-block address. The content addressable memory may output a signal to disable a tagged sub-block if the received address includes the block address and the sub-block address associated with the tagged sub-block. The sub-block disabling circuit may further include a plurality of drivers to drive one or more of the select transistors based on the signal. Other apparatus and methods are described.

18 Claims, 8 Drawing Sheets

(51) Int. Cl.
*G11C 8/06* (2006.01)
*G11C 8/08* (2006.01)

(56) References Cited

U.S. PATENT DOCUMENTS

| | | | |
|---|---|---|---|
| 5,539,894 A | 7/1996 | Webber | |
| 5,699,306 A * | 12/1997 | Lee | G11C 29/70 365/189.05 |
| 5,907,515 A * | 5/1999 | Hatakeyama | G11C 29/80 365/200 |
| 6,243,306 B1 | 6/2001 | Kirihata | |
| 6,262,926 B1 * | 7/2001 | Nakai | G11C 16/08 365/200 |
| 6,414,901 B1 | 7/2002 | Shin | |
| 6,717,862 B2 | 4/2004 | Naso et al. | |
| 6,865,133 B2 * | 3/2005 | Tsukidate | G11C 29/24 365/200 |
| 6,870,749 B1 | 3/2005 | Park et al. | |
| 6,879,504 B1 | 4/2005 | Lien et al. | |
| 7,177,173 B2 | 2/2007 | Futatsuyama | |
| 7,254,681 B2 | 8/2007 | Lai | |
| 8,526,241 B2 | 9/2013 | Shirakawa | |
| 9,007,860 B2 * | 4/2015 | Ha | 365/218 |
| 2007/0147115 A1 | 6/2007 | Lin et al. | |
| 2009/0235017 A1 | 9/2009 | Estakhri et al. | |
| 2010/0259982 A1 | 10/2010 | Byeon et al. | |
| 2010/0322000 A1 | 12/2010 | Shim et al. | |
| 2011/0022601 A1 | 1/2011 | Elrom et al. | |
| 2011/0199825 A1 | 8/2011 | Han et al. | |
| 2012/0051143 A1 | 3/2012 | Yoon et al. | |
| 2014/0241092 A1 | 8/2014 | Ha | |

OTHER PUBLICATIONS

"International Application Serial No. PCT/US2014/019057, Written Opinion mailed May 26, 2014", 8 pgs.

* cited by examiner

SUB-BLOCK DISABLING IN 3D MEMORY

PRIORITY APPLICATION

This application is a continuation of U.S. application Ser. No. 13/781,097, filed Feb. 28, 2013, which is incorporated herein by reference in its entirety.

BACKGROUND

Memory devices, such as flash memory, are widely used in computers and many electronic items. Some memory devices may include memory cells stacked vertically to form three-dimensional (3D) blocks of memory components. Blocks of memory may be tagged as defective during manufacturing testing or during user operations, and these blocks may thereafter be unusable. As 3D memory block size is increased, tagging blocks as defective may result in larger amounts of memory becoming unusable by users.

BRIEF DESCRIPTION OF THE DRAWINGS

Some embodiments are illustrated by way of example and not limitation in the figures of the accompanying drawings in which.

DETAILED DESCRIPTION

A block of memory cells according to various embodiments may function as a block of memory cells in a memory device such as a NOT AND (NAND) memory device. Memory cells may be arranged in a three-dimensional manner.

Figure 1:
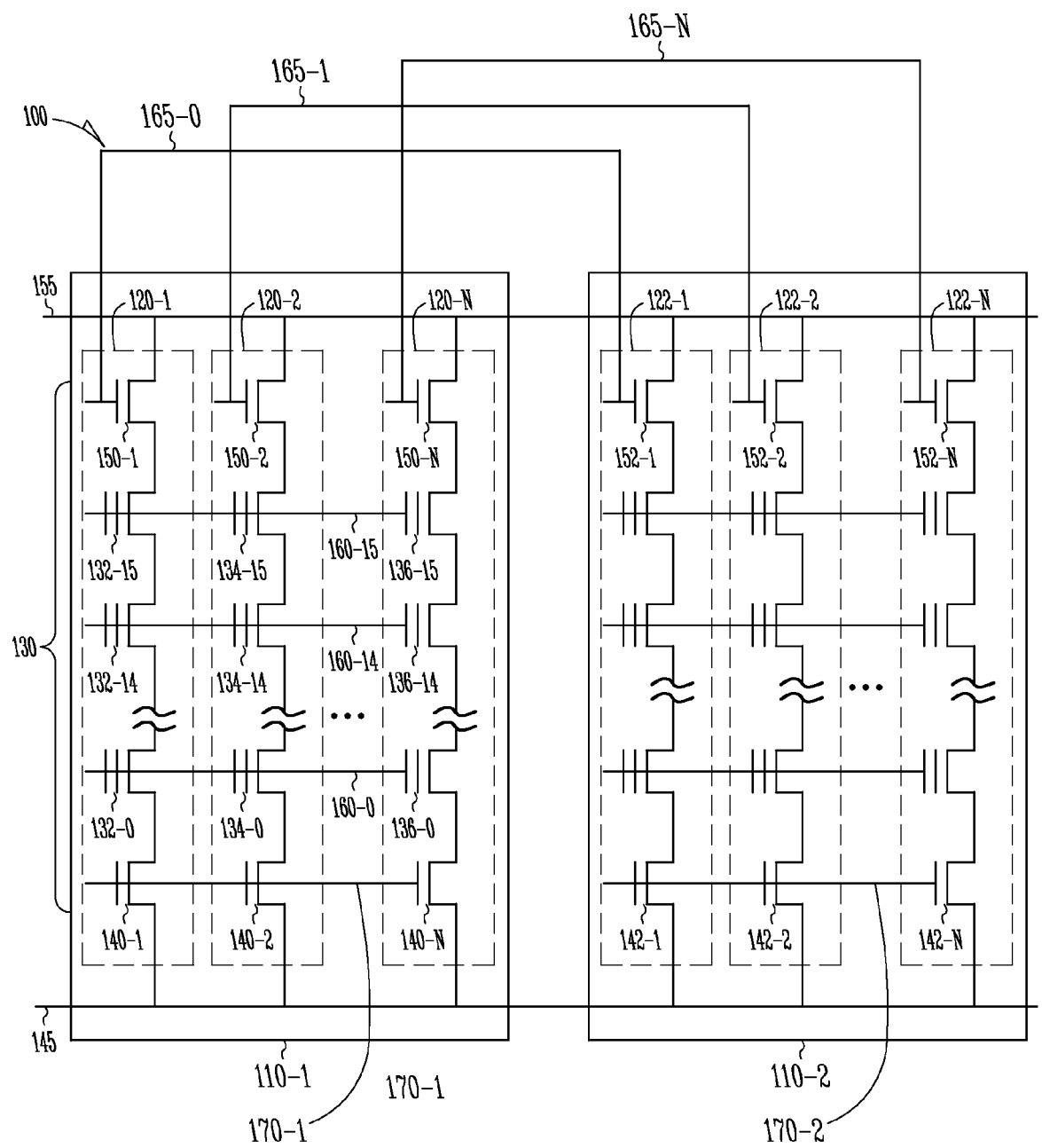
FIG. 1 is an electrical schematic diagram of an apparatus in the form of one or more blocks of vertical strings of memory cells in accordance with some embodiments.

FIG. 1 shows a block diagram of an apparatus in the form of a memory device 100. The memory device 100 may include two or more blocks 110-1, 110-2. Each block 110-1, 110-2 may include two or more sub-blocks 120-1 through 120-$n$. The two or more sub-blocks 120-1 through 120-$n$ may each comprise a vertical string 130. The vertical string 130 may include a number of memory cells 132-0 through 132-15. In the illustrative example, the vertical string 130 includes 16 memory cells. However, it will be understood that the vertical string 130 may include any number of memory cells. The memory cells 132-0 through 132-15 may be coupled in series.

The vertical string 130 may include a source select gate (SGS) transistor 140-1, which is sometimes also referred to herein as a "source select transistor." The SGS transistor 140-1 may be, for example, an n-channel transistor coupled between one of the memory cells 132-0 at one end of the vertical string 130 and a common source 145. The common source 145 may comprise, for example, a slot of commonly doped semiconductor material and/or other conductive material. At the other end of the vertical string 130, a drain select gate (SGD) transistor 150-1, which is sometimes also referred to herein as a "drain select transistor," may be, for example, an n-channel transistor coupled between one of the memory cells 132-15 and a data line 155. The data line may be referred to as a bit line.

Lines 160-0 through 160-15 can form part of access lines of the memory device 100. The access lines may be referred to as word lines. Access lines 160-0 through 160-1 may be shared across corresponding memory cells in corresponding sub-blocks of a block. For example, access line 160-15 may be shared by memory cells 132-15 of sub-block 120-1, 134-15 of sub-block 120-2, and 136-15 of sub-block 120-$n$. Similarly, access line 160-14 may be shared by memory cells 132-14 of sub-block 120-1, 134-14 of sub-blocks 120-2 and 136-14 of sub-block 120-$n$. Each access line may be located in a different tier of a semiconductor construction, as described below with respect to FIG. 2.

The common source 145 can be selectively coupled to a reference voltage Vss or to a voltage source, depending on the desired operation. The reference voltage may be a ground voltage. The voltage source may be a charge pump circuit (not shown). Two elements are coupled directly when they are in direct electrical contact with each other, or indirectly when they are separated by one or more conductors, semiconductors or other elements that enable conduction of a current between the indirectly coupled elements. For example, two elements in direct electrical contact with each other might be in physical contact at a junction that enables a flow of electrons or holes across the junction, without intervening conductive elements. The junction may be a p-n junction.

Each memory cell 132-0 through 132-15 may comprise, for example, a floating gate transistor or a charge trap transistor and may be a single level memory cell or a multilevel memory cell. The memory cells 132-0 through 132-15, the SGS transistor 140-1, and the SGD transistor 150-1 are controlled by signals on their respective control gates.

The SGS transistor 140-1 receives a signal that controls the SGS transistor 140-1 to control conduction between the vertical string 130 and the common source 145. The SGD transistor 150-1 receives a signal that controls the SGD transistor 150-1, so that the SGD transistor 150-1 can be used to select or deselect the vertical string 100. The vertical string 130 can be one of multiple vertical strings of memory cells in a block 110-1 in a memory device 100, such as a NAND memory device.

Each block 110-1, 110-2 may include a source select line 170-1, 170-2, respectively. A first source select line 170-1 may couple to the SGS transistor 140-1 in the first sub-block 120-1, to the SGS transistor 140-2 in the second sub-block 120-2, and to each other SGS transistor in the first block 110-1. Similarly, a second source select line 170-2 may couple to each SGS transistor in the second block 110-2. Some embodiments provide drain select (SGD) lines 165-0 through 160-$n$. The drain select line 165-0 may be coupled to the SGD transistor 150-1 in the first sub-block 120-1 of the first block 110-1, to the SGD transistor 152-1 of the first sub-block 122-1 of the second block 110-2, as well as to the SGD transistors of other first sub-blocks of any blocks (not shown) that form a group including at least the first block 110-1 and 110-2. Similarly, a second drain select line 165-1 may be coupled to the SGD transistor 150-2 of the second sub-block 120-2 of the first block 110-1, to the SGD transistor 152-2 of the second sub-block 122-2 of the second block 110-2, as well as to the SGD transistors of other second sub-blocks of any blocks (not shown) that form a group including at least the first block 110-1 and 110-2. In other words, a drain select line may couple SGD transistors of corresponding sub-blocks in each block in a group of blocks of a memory device.

Figure 2:
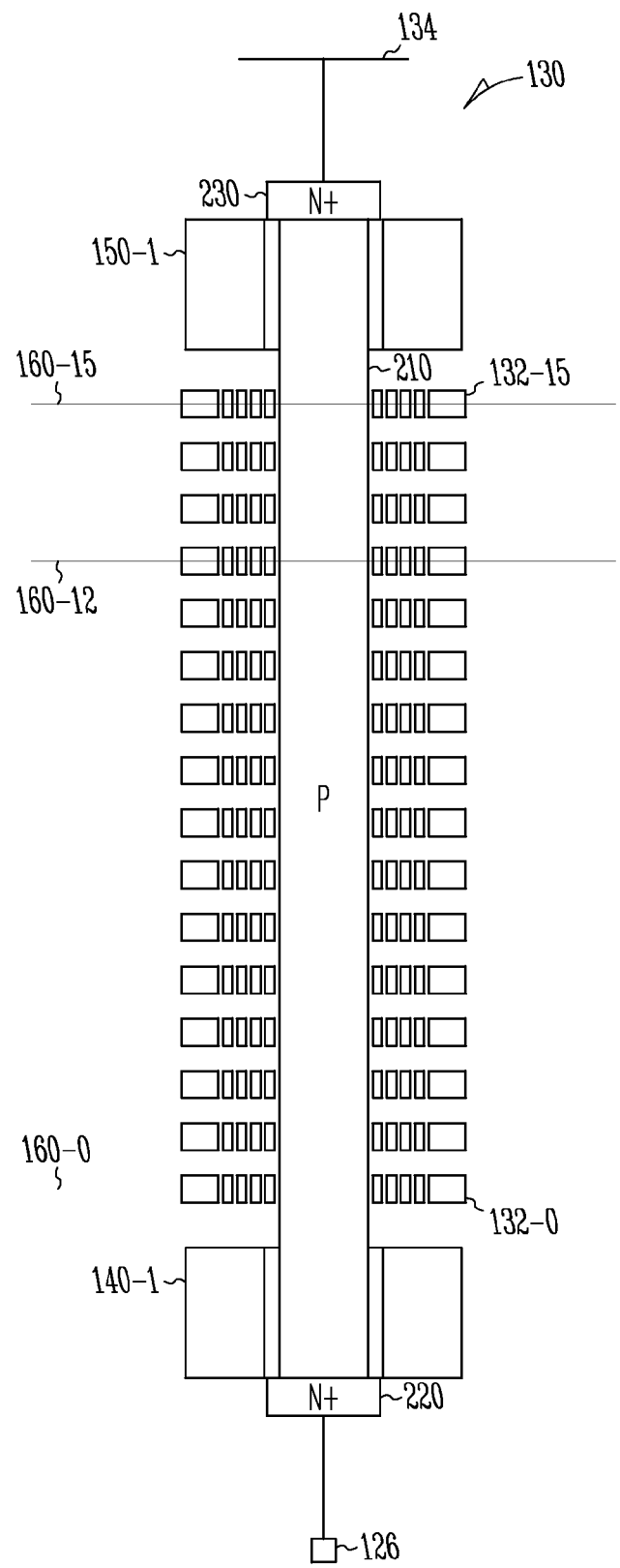
FIG. 2 is a cross-sectional view of a semiconductor construction of a vertical string in accordance with some embodiments.

FIG. 2 is a cross-sectional view of a semiconductor construction of a vertical string 130 of the two or more vertical strings 130 shown in FIG. 1 according to various embodiments. The memory cells 132-0 through 132-15, the SGS transistor 140-1 and the SGD transistor 150-1 at least partially surround a pillar 210 of semiconductor material. The pillar 210 can comprise p type polysilicon and is a channel for the memory cells 132-0 through 132-15, the SGS transistor 140-1 and the SGD transistor 150-1. The memory cells 132-0 through 132-15, the SGS transistor 140-1 and the SGD transistor 150-1 are associated with the pillar 210. The pillar 210 extends between a source cap 220 comprising n+ type polysilicon and a drain cap 230 comprising n+ type polysilicon. The memory cells 132-0 through 132-15 of the vertical string 130 are located in different tiers of the semiconductor construction along a vertical extent of the pillar 210, thus forming the vertical string 130 as a "vertical" string of memory cells. Further, the word lines 160-0 through 160-15 are located in corresponding different tiers of the semiconductor construction along the vertical extent of the pillar 210. The source cap 220 is in electrical contact with the pillar 210 and forms a p-n junction with the pillar 210. The drain cap 230 is in electrical contact with the pillar 210 and forms a p-n junction with the pillar 210. The source cap 220 is a source for the pillar 210 and the drain cap 230 is a drain for the pillar 210. The source cap 220 is coupled to the common source 145. The drain cap 230 is coupled to the data line 155.

Memory devices such as the memory device 100 (FIG. 1) may be shipped by a manufacturer with a certain number of defective blocks. Blocks may also become defective during the lifetime of a memory device. Manufacturers may test memory devices for defective blocks, and may tag defective blocks by storing defective block information in a block of the memory device. A user (e.g., a host or other apparatus accessing the memory device etc.) may then read the defective block information upon initialization (e.g., "boot-up") of the memory device and the user may then avoid accessing the defective blocks (e.g., the host may remap a logical addresses originally associated with a defective block to a redundant block of memory cells). Alternatively, the user may attempt to access defective blocks and determine that the blocks are defective by, for example, reading out all zeroes or all ones from the defective blocks, or verifying programming in under a threshold amount of time. In either case, the user may not utilize the defective block of memory.

As memory devices are manufactured with increasingly large block sizes, tagging a particular block as defective may result in ever-larger amounts of memory becoming unusable. Three-dimensional (3D) memory devices may be characterized as having larger block sizes than some two-dimensional memory devices. Some 3D devices include larger numbers of sub-blocks to provide increased space for electrical routings, with blocks therefore becoming correspondingly larger relative to block size in two-dimensional devices. Accordingly, tagging an entire block of memory as defective in a 3D memory device may result in even larger amounts of memory being tagged as unusable relative to some two-dimensional memory devices.

Some embodiments may serve to allow sub-blocks of memory cells to be selectively disabled, such as through the use of sub-block tagging, allowing users to utilize more memory space in 3D memory devices. Some embodiments may also provide block tagging in addition to sub-block tagging. For example, block tagging may be used when more than a threshold number of (e.g., a majority or all) sub-blocks in a block are determined (e.g., found, discovered, tested, etc.) to be defective.

Figure 3:
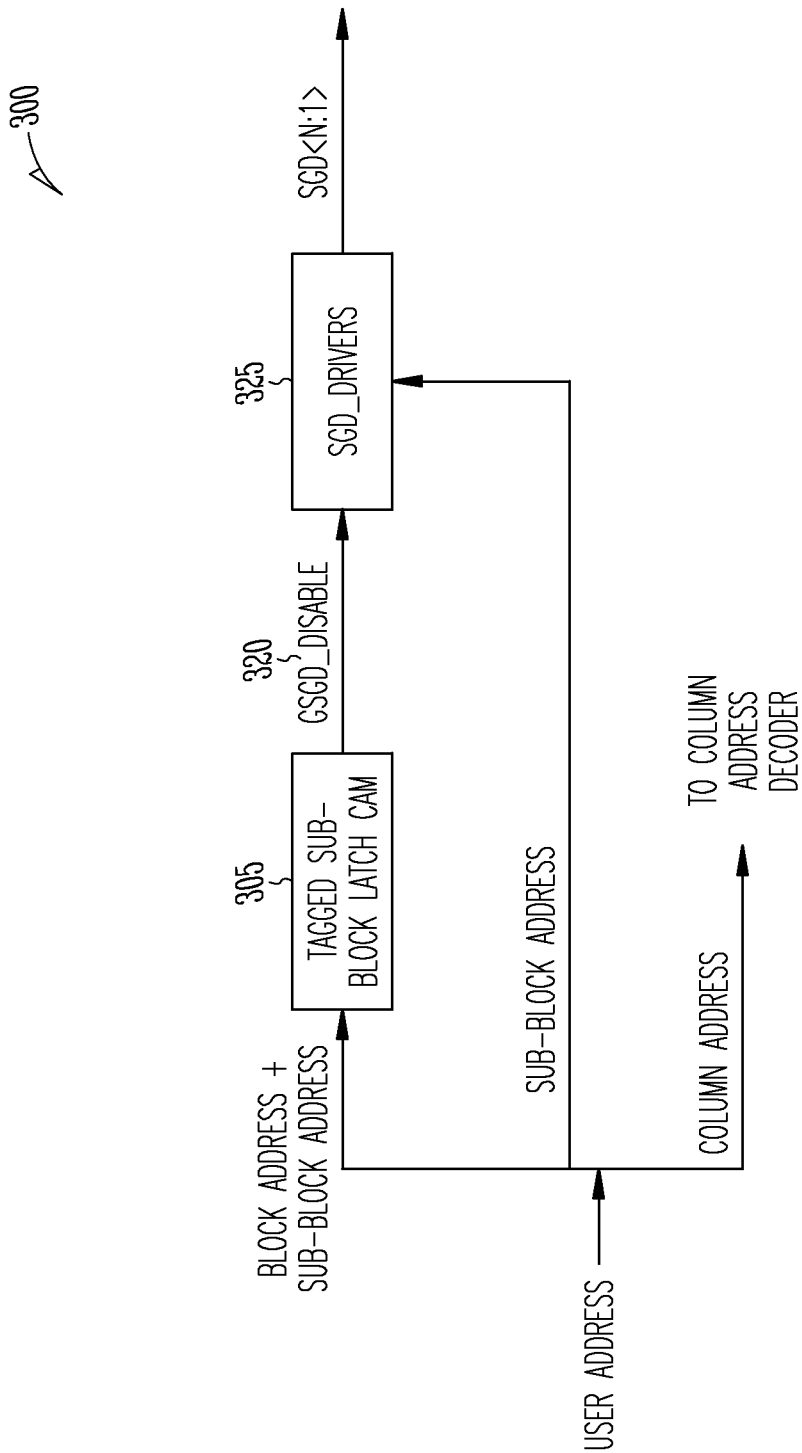
FIG. 3 is a block diagram of a sub-block disabling circuit in accordance with some embodiments.
Figure 4A:
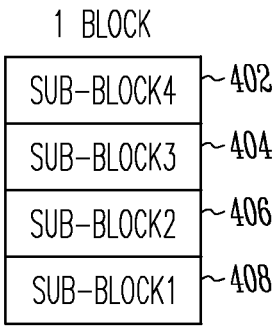
FIGS. 4A-4E are block diagram illustrating sub-block tag mappings in accordance with some embodiments.
Figure 4B:
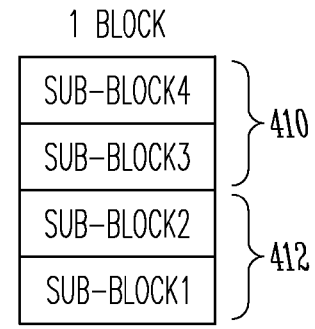
Figure 4C:
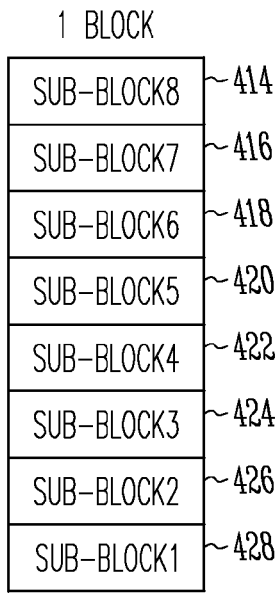
Figure 4D:
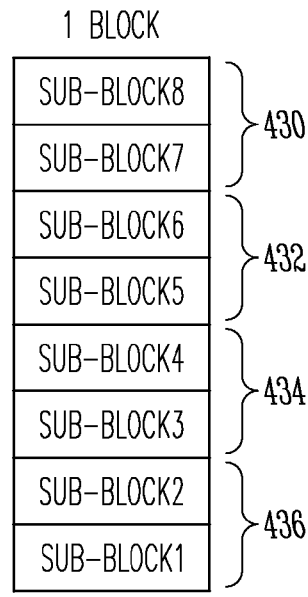
Figure 4E:
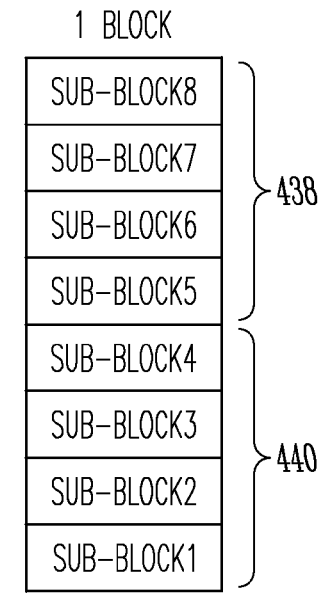

FIG. 3 is a block diagram of a sub-block disabling circuit 300 in accordance with many embodiments. The sub-block disabling circuit 300 may be operative when, for example, the user attempts to access tagged sub-blocks. The sub-block disabling circuit 300 may include a memory, for example a content-addressable memory (CAM) 305 or a static random-access memory (SRAM) (not shown). The CAM 305 (or the SRAM if an SRAM is used instead of CAM) may have stored therein information associated with sub-blocks determined to be defective (sometimes referred to hereinafter as "defective sub-block information"), such as those determined to be defective during manufacturing testing and/or during user operation. Hereinafter, the description of example embodiments will refer to the CAM 305, but it will be understood that an SRAM may be used in place of the CAM 305. The information may include a block address and sub-block address associated with the defective sub-block. The CAM 305 may be loaded with defective sub-block information on power-up of the memory device, for example, such as during a memory initialization process. The memory initialization process may be a NAND initialization process.

The CAM 305 may receive a user address 310, which may be an address at which a user of the memory device 100 wishes to access the memory device 100. The user address 310 may include a block address and sub-block address.

If the block address and sub-block address corresponding to the user address 310 are found in the CAM 305, this may signify that the sub-block that the user is trying to access is a sub-block tagged as being defective. Therefore, the CAM 305 may output a signal 320 to disable the tagged sub-block. For example, the CAM 305 may output a global SGD disable ("gsgd_disable") signal "high." The signal 320 may be input to one of a plurality of SGD drivers 325, which are configured to drive drain select (SGD) transistors 150-1, 150-2, 150-n, 152-1, 152-2, or 152-n (FIG. 1). The signal 320, being a gsgd_disable "high" may, in some embodiments, output a signal to at least one of the drivers of the SGD drivers 325. This in turn causes the gates of corresponding at least one of the SGD transistors 150-1, 150-2, 150-n, 152-1, 152-2 or 152-n to be biased at a ground potential, thereby disabling at least one of the SGD transistors 150-1, 150-2, 150-n, 152-1, 152-2 or 152-n. This will result in the user obtaining a read result (for a read operation) of, for example, all zeroes, for the respective sub-block, and the user will therefore be notified that the sub-block is a defective sub-block. One or more components of the sub-block disabling circuit 300 may be implemented on a memory controller 642, described below with respect to FIG. 6.

Referring to FIGS. 4A-4E, some embodiments may serve to reduce the amount of information to be stored in the CAM 305 by tagging groups of sub-blocks rather than tagging each sub-block individually. With respect to FIG. 4A, each defective sub-block 402, 404, 406, 408 in a block comprised of four sub-blocks can be tagged by storing information for each sub-block in the CAM 305. With respect to FIG. 4B, sub-blocks 410 or sub-blocks 412 can be tagged by storing information once for a group of sub-blocks 410 or 412. In one or more embodiments, if more than one half of the block is defective, block tagging, instead of sub-block tagging, may be used as discussed below with respect to FIG. 5. With respect to FIG. 4C, each defective sub-block 414, 416, 418, 420, 422, 424, 426 or 428 in a block comprised of eight sub-blocks can be tagged by storing information for each sub-block in the CAM 305. With respect to FIG. 3D, two sub-blocks may be tagged together by storing information for groups 430, 432, 434 and 436. With respect to FIG. 4E, half of a block 438 or 440 may be tagged by storing information once for a group of sub-blocks 438, 440. As with the case of blocks comprised of four sub-blocks, if more than half of the block is defective, block tagging and disabling, discussed below with respect to FIG. 5, may be more efficient than sub-block tagging and disabling.

Figure 5:
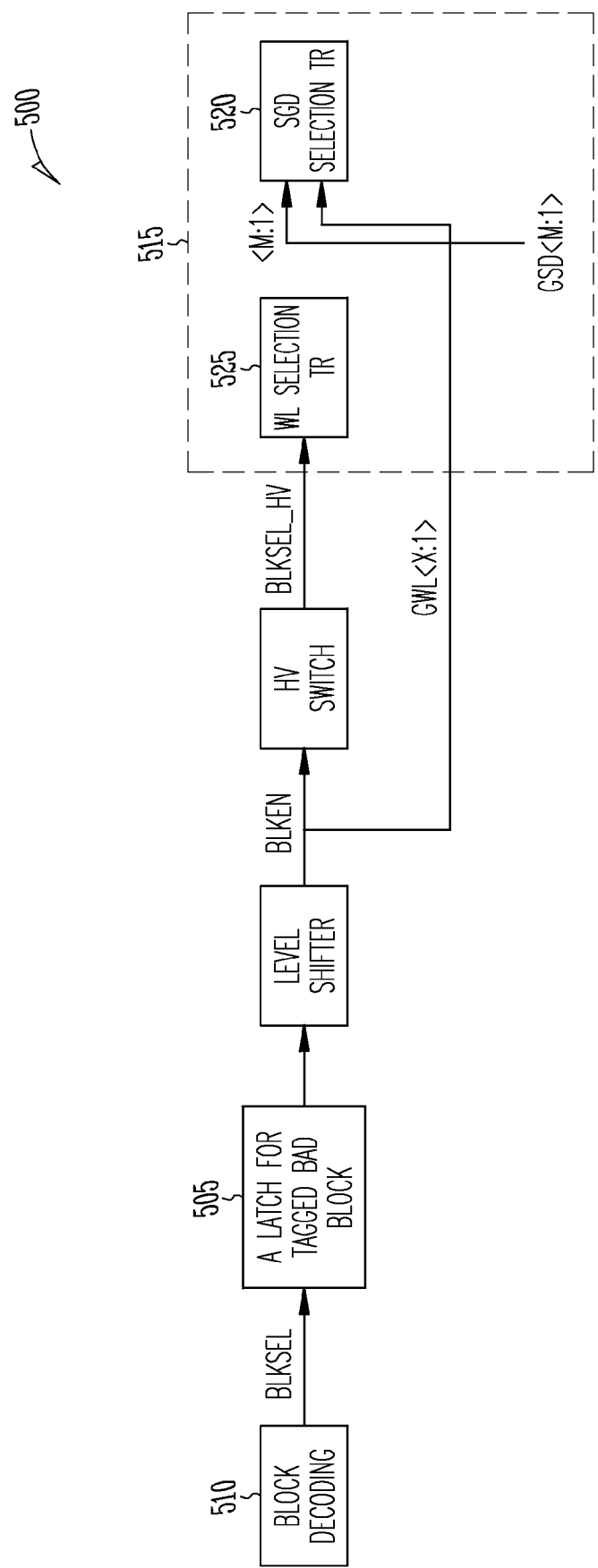
FIG. 5 is a block diagram of a block disabling circuit in accordance with some embodiments.

Referring to FIG. 5, many embodiments also provide a block disabling circuit to disable an entire block 110-1, 110-2 (FIG. 1). Block disabling may be used in cases in which larger amounts of memory, for example more than one-half of the sub-blocks in a block, are determined to be defective. The block disabling circuit 500 may include a latch 505 for storing a tag status of a block 110-1, 110-2. The latch 505 may be loaded with defective block information on initialization of the memory device 100. The latch 505 may receive a block selection signal ("blksel") from a block decoder 510. Based on whether the block designated in blksel was tagged as defective, the latch 505 outputs a block enable signal ("blken") to enable or disable the block. The blken signal is then input to a string driver portion 515 to select sub-blocks 520 and word lines 525. If the blken signal indicates that the block is disabled, further access to word lines and sub-blocks within that block may be prohibited. One or more components of the block tagging circuit 500 may be implemented on a memory controller 642, described below with respect to FIG. 6.

Figure 6:
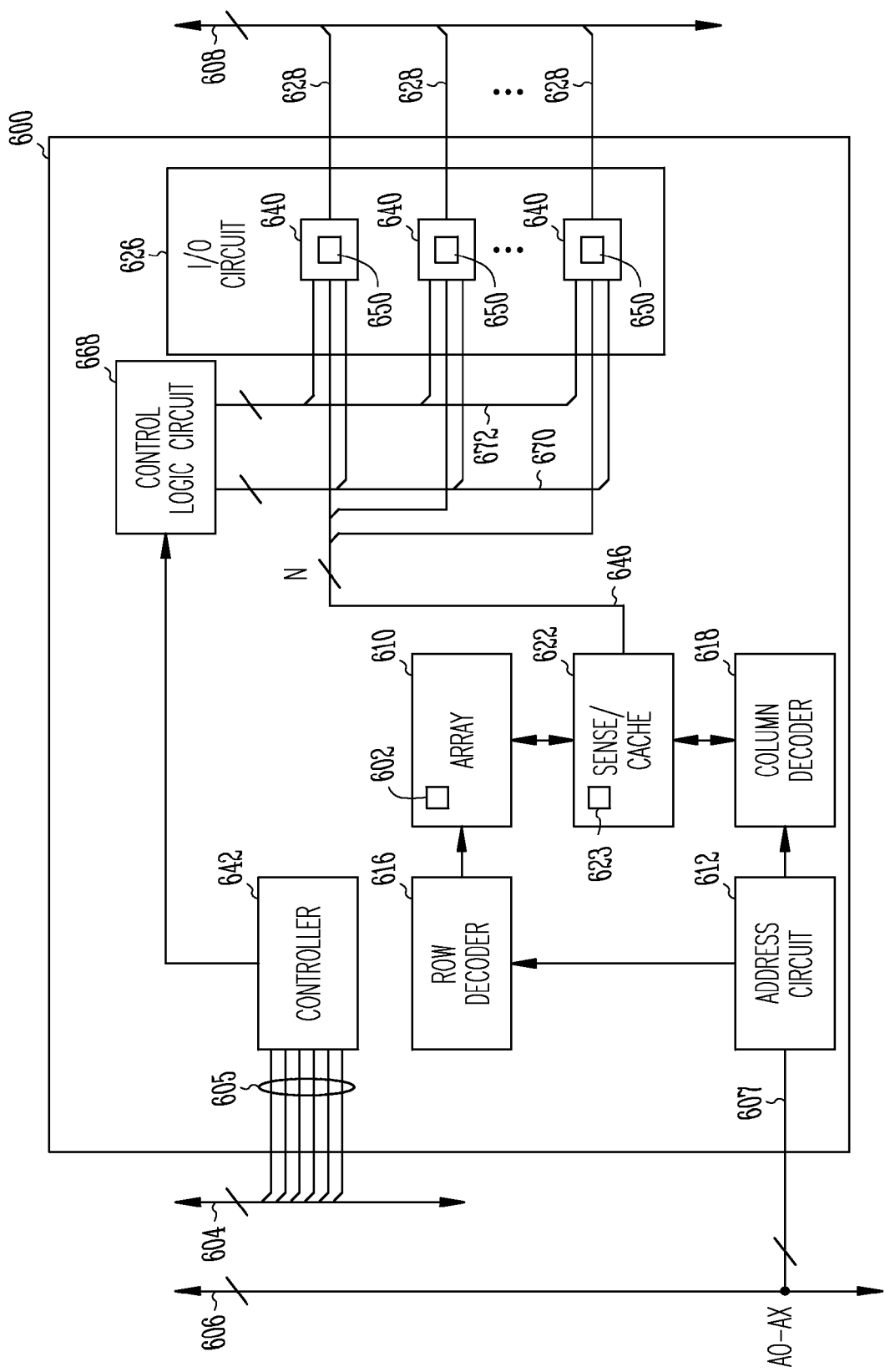
FIG. 6 is a block diagram of a memory device in accordance with some embodiments.

FIG. 6 is a block diagram of an apparatus in the form of a memory device 600 according to various embodiments. The memory device 600 may be coupled to a control bus 604 to receive multiple control signals over control signal lines 605. The memory device 600 may be further coupled to an address bus 606 to receive address signals AO-Ax on address signal lines 607 and to a data bus 608 to transmit and receive data signals. Although depicted as being received on separate physical busses, the data signals may also be multiplexed and received on the same physical bus. The memory device 600 may be coupled to a processor (not shown) in a system.

The memory device 600 may include one or more arrays 610 of memory cells that may be arranged in rows and in columns. The memory cells of the array 610 may comprise non-volatile memory cells according to various embodiments of the invention. The non-volatile memory cells may be, for example, charge storage devices, such as floating gate transistors or charge trap transistors, or variable resistance devices, such as phase change material (PCM) cells or magnetic tunnel junction (MTJ) cells. In one or more embodiments, the memory device 600 may be a NAND memory device, such as a 3D NAND memory device. The array 610 may include multiple banks and blocks of memory cells residing on a single die or on multiple dice as part of the memory device 600. The array 610 may include one or more of the blocks 110-1 through 110-n (FIG. 1) according to various embodiments of the invention.

A data input and output (I/O) circuit 626 may implement bi-directional data communication over external (e.g., data I/O) nodes 628 coupled to the data bus 608. The I/O circuit 626 may include N driver and receiver circuits 640 according to various embodiments. The memory device 600 may include a controller 642 that is configured to support operations of the memory device 600, such as writing data to and/or erasing data from the array 610. The controller 642 may comprise, for example, control circuitry (e.g., configured to implement a state machine) on a same or different die than that which includes the array 610 and/or any or all of the other components of the memory device 600. The controller may comprise the control circuitry 642, firmware, software or combinations of any or all of the foregoing, whether alone or in combination with other circuitry. Data may be transferred between the sense/cache circuit 622 and the I/O circuit 626 over N signal lines 646. Operations using the memory device may be implemented using the controller.

The memory controller 642 may determine that a sub-block is defective during a read operation or a write operation on the sub-block. Based on this determination, the memory controller 642 may store, in the CAM 305 (FIG. 3), a block address and sub-block address associated with the sub-block to tag the sub-block as a defective sub-block. The CAM 305 may be located on the memory controller 642. Other components of the sub-block tagging circuit of FIG. 3 may be located on the memory controller 642. In some embodiments, defective sub-block information may be passed to the user computer.

Figure 7:
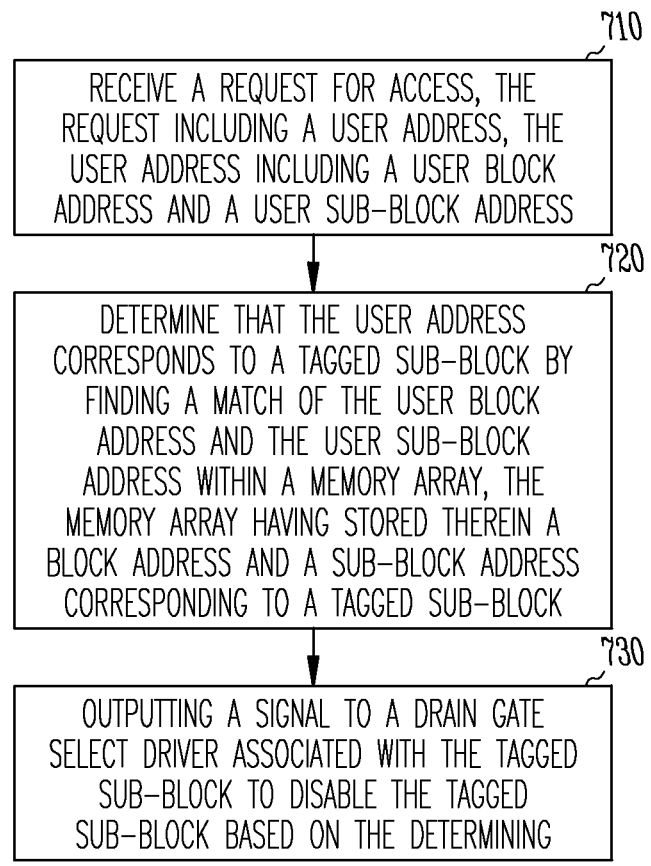
FIG. 7-9 are flow diagrams of methods in accordance with some embodiments.

FIG. 7 illustrates a method for controlling access to a memory device in accordance with many embodiments. In operation 710, a memory controller may receive a request for access to the memory device. The request may include a user address. The user address may include a block address and sub-block address. One such memory controller was described above with respect to the memory controller 642 (FIG. 6). In one or more embodiments, the memory device may be a NOT AND (NAND) memory device, such as a 3D NAND memory device.

In operation 720 the memory controller 642 may determine that the user address corresponds to a tagged sub-block by finding a match of the block address and sub-block address within a memory. As described above with respect to FIG. 3, the memory may tag defective sub-blocks of the device by storing information on sub-blocks determined to be defective in the memory device. For example, the memory may have stored therein a block address and sub-block address associated with a tagged sub-block. The memory may be, for example, a CAM 305 (FIG. 3) or SRAM. In operation 730, the memory controller 642 may output a signal to a drain select gate driver associated with the tagged sub-block to disable the tagged sub-block based on the determination that the sub-block was tagged as defective.

The memory controller 642 may determine that a sub-block is defective during a read operation or a write operation on the sub-block. Based on this determination, the memory controller 642 may store, in the CAM 305, a block address and sub-block address associated with such a sub-block to tag the sub-block as a defective sub-block.

Figure 8:
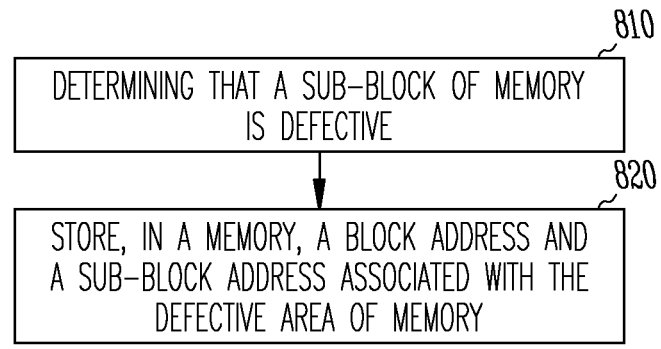

FIG. 8 illustrates a method for indicating a defect in a memory device in accordance with many embodiments. In operation 810, a memory controller 642 may determine that a sub-block of the memory device is defective.

In operation 820 the memory controller 642 may store, in a memory such as the CAM 305, information associated with a defective sub-block of the memory device. The information may be a block address and sub-block address associated with the defective sub-block. The memory controller 642 may store a block address and sub-block address for a group of sub-blocks, where the group includes the defective sub-block. The group may include two sub-blocks. The group may include one half of the sub-blocks in a respective block.

Figure 9:
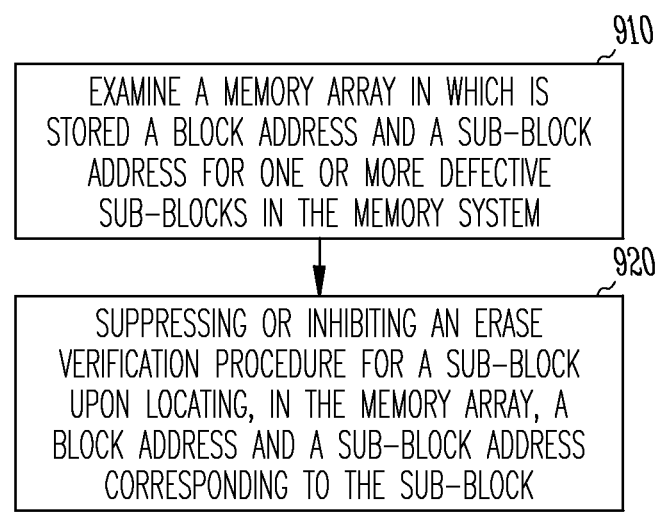

FIG. 9 illustrates a method for erasing memory in a memory device in accordance with many embodiments. In operation 910, a memory controller 642 may examine a memory 305 in which is stored a block address and sub-block address for one or more defective sub-blocks in the memory device.

In operation 920 the memory controller 642 may suppress an erase verification procedure for a sub-block responsive to (e.g., upon) finding, in the memory 305, a block address and sub-block address associated with the sub-block. When a sub-block is found within the memory 305, this may signify that the sub-block is defective. If an erase verification procedure is performed on defective sub-blocks, the verification procedure may continue for a large amount of time, thereby creating possible inefficiencies in the erase procedure. Many embodiments, therefore, may suppress or inhibit the erase verification procedure to enhance the efficiency of the erase process.

The memory controller 642 may further monitor the memory 305 for each sub-block of memory to be erased. If a sub-block fails during an erase procedure, the memory controller 642 may tag the corresponding block by, for example, writing the block information in a memory.

Example structures and methods of operating blocks of vertical strings of memory cells have been described as specific embodiments, but it will be evident to those of ordinary skill in the art, after reading and understanding the content of this disclosure, that various modifications and changes may be made. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. The Abstract is submitted with the understanding that it will not be used to interpret or limit the claims.

What is claimed is:

1. An apparatus comprising:
a plurality of blocks of memory cells, at least one of the plurality of blocks including two or more sub-blocks;
a sub-block disabling circuit including a memory to store a block address and sub-block address associated with a sub-block determined to be defective, wherein the sub-block disabling circuit is configured to disable a sub-block associated with the stored block address and sub-block address responsive to receiving a block address and sub-block address that matches the stored block address and sub-block address, and the sub-block disabling circuit further comprises a drain select gate (SGD) driver, wherein the sub-block disabling circuit is configured to disable the sub-block associated with the stored block address and sub-block address responsive to receiving a block address and sub-block address that matches the stored block address and sub-block address.

2. The apparatus of claim 1, wherein the sub-block disabling circuit is configured to disable the SGD driver responsive to receiving a block address and sub-block address that matches the stored block address and sub-block address.

3. The apparatus of claim 1, further comprising:
a block disabling circuit including
a latch, the latch to store a tag status of a block and the latch arranged to receive a block selection signal and output a block enablement signal based on the tag status of the block.

4. The apparatus of claim 1, wherein each block of the plurality of blocks of memory cells is associated with at least four access lines, each of the at least four access lines being located in a different tier of a semiconductor construction.

5. The apparatus of claim 1, wherein the apparatus comprises a memory device.

6. The apparatus of claim 5, wherein the apparatus comprises a three-dimensional NOT AND (NAND) memory device.

7. The apparatus of claim 1, wherein the sub-block disabling circuit is configured to disable a plurality of sub-blocks.

8. The apparatus of claim 7, wherein the sub-block disabling circuit is configured to disable one half the sub-blocks in a block.

9. A method for controlling access to a memory device, the method comprising:
receiving a sub-block address;
determining whether the received sub-block address match a stored sub-block address, wherein the stored sub-block address is associated with a sub-block of memory cells determined to be defective; and
responsive to determining the received sub-block address matches the stored sub-block address, disabling a block associated with the stored sub-block address if a threshold number of sub-blocks associated with a block associated with the sub-block address have been tagged as defective.

10. The method of claim 9, wherein determining whether the received sub-block address matches a stored sub-block address comprises determining whether the received sub-block address matches a sub-block address stored in a memory.

11. The method of claim 10, wherein determining whether the received sub-block address matches a sub-block address stored in a memory comprises determining whether the received sub-block address matches a sub-block address stored in a content-addressable memory.

12. The method of claim 11, further comprising:
receiving a block address; and
determining whether the received block address matches a stored block address that was stored in a second memory separate from the content-addressable memory.

13. The method of claim 9, further comprising:
generating a count of sub-block of memory cells that were tagged as defective in the block based on matches with stored sub-block addresses; and
disabling only the sub-block associated with the stored sub-block address if the count is less than the threshold number of sub-blocks of the associated block were tagged as defective.

14. The method of claim 9, further comprising:
generating a count of sub-block of memory cells that were tagged as defective in the block based on matches with stored sub-block addresses; and
disabling one half of the sub-blocks associated with the block if less than the threshold number of sub-blocks of the associated block were tagged as defective.

15. An apparatus comprising: a plurality of blocks of memory cells, at least one of the plurality of blocks including two or more sub-blocks; and a memory controller including a memory to store a block address and a sub-block address associated with a sub-block of the memory device determined to be defective, wherein the memory controller further comprises a second memory for storing a block address associated with a block of the memory device determined to be defective.

16. The apparatus of claim 15, wherein the memory controller is configured to
examine the memory to determine if a block address and sub-block address of a received user address matches a block address and sub-block address stored in the memory; and disable a sub-block associated with a block address and sub-block address stored in the memory responsive to determining that a block address and sub-block address of a received user address matches the block address and sub-block address stored in the memory.

17. The apparatus of claim 16, wherein the memory controller is configured to disable a plurality of sub-blocks responsive to determining that the block address and sub-block address of a received user address matches the block address and sub-block address stored in the memory.

18. The apparatus of claim 15, wherein the plurality of blocks of memory cells are included in a three-dimensional NOT AND (NAND) memory device.

\* \* \* \* \*